US011248757B2

(12) United States Patent
Mülders et al.

(10) Patent No.: US 11,248,757 B2
(45) Date of Patent: Feb. 15, 2022

(54) LIGHTING DEVICE COMPRISING CONNECTION ELEMENT WITH SPRING SECTION

(71) Applicant: LUMILEDS HOLDING B.V., Schiphol (NL)

(72) Inventors: Barbara Mülders, Aachen (DE); Danijel Labas, Baesweiler (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/294,424

(22) Filed: Mar. 6, 2019

(65) Prior Publication Data

US 2019/0279969 A1 Sep. 12, 2019

(30) Foreign Application Priority Data

Mar. 8, 2018 (EP) ..................................... 18160642
Oct. 25, 2018 (EP) ..................................... 18202570

(51) Int. Cl.
*F21S 4/22* (2016.01)
*H01L 25/075* (2006.01)
(Continued)

(52) U.S. Cl.
CPC . *F21S 4/22* (2016.01); *F21S 4/24* (2016.01); *F21S 41/141* (2018.01);
(Continued)

(58) Field of Classification Search
CPC .... F21S 4/22; F21S 4/24; H05B 45/00; F21V 21/005; F21V 23/005; F21V 23/001; F21V 23/06; H01K 25/075
See application file for complete search history.

(56) References Cited

U.S. PATENT DOCUMENTS 3,633,023 A * 1/1972 Castiglioni .............. H01K 7/06
362/219
4,413,311 A * 11/1983 Orenstein ............. E05B 1/0015
362/145
(Continued)

FOREIGN PATENT DOCUMENTS

| EP | 3081845 A1 | 10/2016 |
| EP | 3136829 A1 | 3/2017 |
| WO | 2017/157753 A1 | 9/2017 |

OTHER PUBLICATIONS

International Preliminary Report on Patentability dated Sep. 8, 2020 for PCT International Application No. PCT/EP2019/054842.
(Continued)

*Primary Examiner* — Bryon T Gyllstrom
(74) *Attorney, Agent, or Firm* — Volpe Koenig

(57) ABSTRACT

The invention refers to a lighting device. The object to provide a lighting device in particular with flexible properties, wherein the mechanical robustness with respect to thermomechanical stresses is improved, is solved in that the lighting device comprises: at least one light-emitting element, wherein the at least one light-emitting element is arranged on connection elements for an electronic connection to the at least one light-emitting element, at least one encapsulating material surrounding at least part of the connection elements, wherein at least one connection element comprises at least one spring section. The invention further refers to a method for producing a lighting device and a use of a lighting device.

20 Claims, 3 Drawing Sheets

(51) Int. Cl.
  *F21S 4/24* (2016.01)
  *F21S 41/141* (2018.01)
  *F21V 21/005* (2006.01)
  *F21V 23/06* (2006.01)
  *F21V 23/00* (2015.01)
  *H05B 45/00* (2020.01)
  *F21Y 103/10* (2016.01)
  *F21Y 115/10* (2016.01)
  *F21S 41/151* (2018.01)
  *F21S 43/15* (2018.01)

(52) U.S. Cl.
  CPC .......... *F21V 21/005* (2013.01); *F21V 23/001* (2013.01); *F21V 23/06* (2013.01); *H01L 25/075* (2013.01); *H05B 45/00* (2020.01); *F21S 41/151* (2018.01); *F21S 43/15* (2018.01); *F21Y 2103/10* (2016.08); *F21Y 2115/10* (2016.08)

(56) References Cited

U.S. PATENT DOCUMENTS

| | | | |
|---|---|---|---|
| 6,447,106 B1 | 9/2002 | Watanabe et al. | |
| 10,203,075 B1 * | 2/2019 | Kim | F21V 23/06 |
| 2007/0091596 A1 * | 4/2007 | Grossman | F21V 23/002 |
| | | | 362/217.09 |
| 2009/0296380 A1 | 12/2009 | Shen et al. | |
| 2009/0296382 A1 * | 12/2009 | Maier | H01L 33/54 |
| | | | 362/218 |
| 2010/0164409 A1 | 7/2010 | Lo et al. | |
| 2012/0075871 A1 * | 3/2012 | Chen | F21S 2/005 |
| | | | 362/362 |
| 2012/0256813 A1 | 10/2012 | Kostka et al. | |
| 2014/0062316 A1 | 3/2014 | Tischler et al. | |
| 2014/0268780 A1 * | 9/2014 | Wang | F21S 4/22 |
| | | | 362/249.06 |
| 2015/0167910 A1 | 6/2015 | Stoyan | |
| 2015/0308632 A1 * | 10/2015 | Ueno | F21K 9/60 |
| | | | 362/235 |
| 2015/0338080 A1 | 11/2015 | Dexter et al. | |
| 2016/0332018 A1 * | 11/2016 | Granat | A63B 19/00 |
| 2017/0356635 A1 | 12/2017 | Zawacki et al. | |
| 2018/0178422 A1 | 6/2018 | Harrison | |
| 2019/0051803 A1 * | 2/2019 | Kums | H01L 23/49575 |

OTHER PUBLICATIONS

International Search Report dated Sep. 12, 2019 for PCT International Application No. PCT/EP2019/054842.
International Preliminary Report on Patentability dated Sep. 8, 2020 for PCT International Application No. PCT/EP2019/054882.
International Search Report dated Sep. 12, 2019 for PCT International Application No. PCT/EP2019/054882.
Extended European Search Report dated Jul. 12, 2019 for European Patent Application No. 18202570.0.
Extended European Search Report dated Jul. 9, 2019 for European Patent Application No. 18160642.7.

* cited by examiner

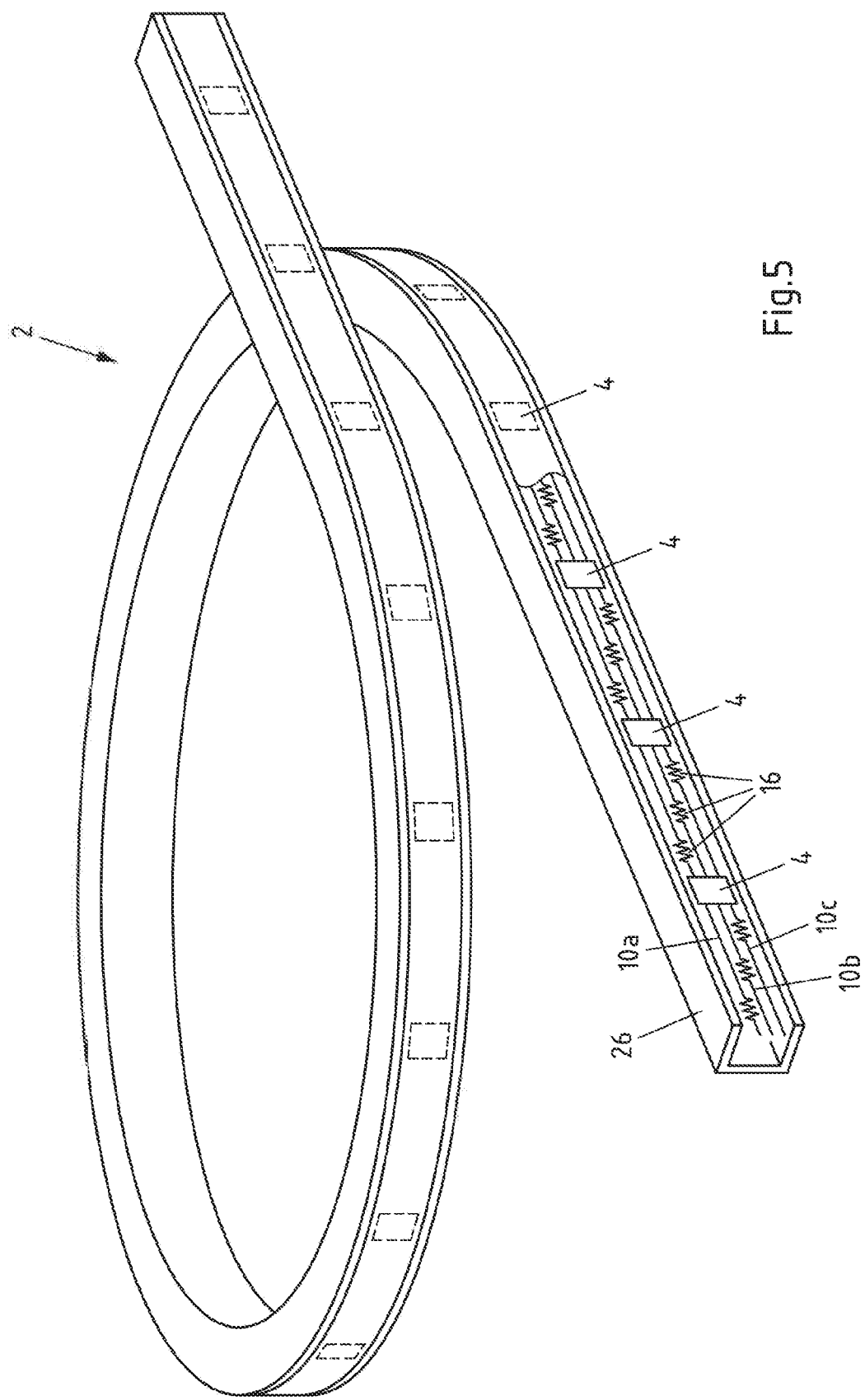

LIGHTING DEVICE COMPRISING CONNECTION ELEMENT WITH SPRING SECTION

FIELD OF INVENTION

The present disclosure relates to lighting devices comprising at least one light-emitting element, such as at least one light-emitting diode (LED), arranged on connection elements.

BACKGROUND

Light-emitting elements such as LEDs are typically arranged on a substrate that is also used for electrical connection to the light-emitting element. For instance, light-emitting elements may be arranged on a printed circuit board that comprises conductive tracks to provide the light-emitting element with electrical energy. However, substrates such as a printed circuit boards may restrict the shape of a lighting device, e.g. to an essentially flat shape in case of a simple board.

For many applications, it is desirable to provide a lighting device that can be brought into various shapes and has for instance flexible properties. A flexible lighting device may be used to conform the shape of an object. For example, in automotive applications, a flexible lighting device may follow a surface or lines of a car body or of car interior panels. Similarly, flexible lighting devices may be used in architecture or interior decoration and may easily be integrated into structures.

A possibility to obtain flexible properties for the lighting device while providing electrical connections is to use flexible connection elements instead of rigid substrates. For example, multiple light-emitting elements such as LEDs may be arranged on wires that provide an electrical connection to the LEDs and between the LEDs. To obtain satisfactory mechanical properties of the lighting device and protection for both the wires and the LEDs, at least part of the lighting device may be encapsulated with a flexible material.

However, in particular due to the high heat output of light-emitting elements such as LEDs during operation, wires that are encapsulated in a flexible material may be subject to high heat stress and temperature gradients. Corresponding flexible lighting devices may therefore suffer from mechanical impairment and may be problematic in terms of longevity.

SUMMARY

It is an object of the present invention to provide a lighting device in particular with flexible properties, wherein the mechanical robustness with respect to thermomechanical stresses is improved. The invention further relates to a method for producing such a lighting device and a use of such a lighting device based on the aforementioned object.

According to a first aspect of the present invention, a lighting device is provided, comprising: at least one light-emitting element, wherein the at least one light-emitting element is arranged on connection elements for an electronic connection to the at least one light-emitting element, at least one encapsulating material surrounding at least part of the connection elements, wherein at least one connection element comprises at least one spring section.

According to a second aspect of the present invention, a method for producing a lighting device is provided, in particular the lighting device according to the first aspect, the method comprising: providing at least one light-emitting element; providing connection elements and establishing an electronic connection to the at least one light-emitting element by means of the connection elements, wherein at least one connection element comprises at least one spring section; and surrounding at least part of the connection elements and in particular the at least one spring section with at least one encapsulating material.

According to a third aspect of the present invention, a use of a lighting device according to the first aspect is provided in automotive lighting, in particular as automotive interior light.

Exemplary embodiments of the first, second and third aspect of the invention may have one or more of the properties described below.

At least one light-emitting element is provided, wherein the at least one light-emitting element has in particular rigid properties. The at least one light-emitting element is arranged on connection elements for an electronic connection to the at least one light-emitting element. For instance, the connection elements comprise or consist of an electrically conductive material such as Cu, Ag, Al and/or their alloys. In some embodiments, the connection elements have an elongated shape with a main extension direction. In particular, the connection elements may have a substantially constant cross section along the main extension direction. The connection elements may be configured to provide a connection from an external or internal power source to the at least one light-emitting element.

At least one encapsulating material surrounds at least part of the connection elements. The at least one encapsulating material may further surround at least part of the at least one light-emitting element. The encapsulating material may provide protection for the connection elements and in particular the at least one light-emitting element against environmental influences such as mechanical impairment and humidity, for example. The encapsulating material has preferably electrically insulating properties and provides insulation to the connection elements. In some embodiments, the at least one light-emitting element and the connection elements may be arranged in a housing, which may for instance define the outer shape of the lighting device. The housing may be at least partially filled by the at least one encapsulating material to surround at least part of the connection elements and in particular the at least one light-emitting element. The at least one encapsulating material may further be transparent for the light emitted by the at least one light-emitting device, in particular when the at least one light-emitting device is also surrounded at least partially by the encapsulating material. In some embodiments, the connection elements and the at least one light-emitting device are surrounded entirely (i.e. are completely encapsulated) by the at least one encapsulating material.

At least one connection element comprises at least one spring section. It has been found that problems with the stability of the lighting device may predominantly be caused by heat stresses, in particular due rapid heating and cooling sequences when the device is switched on and off. The combination of connection elements and encapsulating material has been found to be in particular problematic due to typically large differences in thermal expansion, as the connection elements are typically based on metallic materials while insulating materials like plastics and polymers may be used as encapsulating materials. The differences in thermal expansion may lead to impairment of the contact between the connection elements and the light-emitting element, e.g. solder patches, and of the material of the connection elements themselves. With the at least one spring section, the connection elements may bend during heating up and cooling off to compensate at least part of the heat stresses that are induced in particular at an interface to the encapsulating material.

The connection element may have a shape in the spring section that can at least partially be obtained by winding the connection element around an object, e.g. around a forming tool such as a mandrel or a roll. For example, the connection element may comprise the shape of a loop or at least part of a loop in the spring section. After winding the connection element around an object, the spring section may optionally be further deformed into the final shape of the connection element. That the at least one connection element comprises a spring section may in particular be further understood in that the connection element has a shape deviating from an extension direction of the connection element.

Further, the connection elements may have elastic properties due to the spring section. In particular, the spring section may be configured to have elastic properties (i.e. the spring section may be deformed substantially without plastic deformation) corresponding to the thermal expansion of the at least one encapsulating material. As temperature difference causing the thermal expansion, the temperature differences that occurs by operation of the lighting device may be considered, in particular due to the waste heat of the at least one light-emitting element.

The connection element may have a "three-dimensional" shape in the spring section in that the shape deviates from the extension direction (which represents a first dimension) into the other two dimensions. Accordingly, in comparison to connection elements that only comprise a simple bent section, e.g. a bent section with a substantially two-dimensional shape, the spring section of the connection elements in the lighting device according to the present invention may provide for a bending in multiple directions and therefore an improved compensation of thermal expansion differences between the connection elements and the encapsulating material. As a consequence, the thermal and mechanical stability, as well as the longevity of the lighting device are enhanced.

In an exemplary embodiment of the invention, the connection elements are configured as wires. Hence, the lighting device may be based on at least one light-emitting element arranged on wires. Wires may have flexible properties and allow for a cost-effective production of the lighting device. Wires are also available in different cross sections and materials, such that the requirements of the mechanical and electrical properties of the lighting device can be satisfied by configuring the wires accordingly. In particular, wires with a substantially circular cross section may be used.

In another exemplary embodiment of the invention, multiple light-emitting elements are provided. In particular, the connection elements may provide an electronic connection between the multiple light-emitting elements. For instance, one of the light-emitting elements is connected to the next neighboring light-emitting element by means of connection elements. At least one spring section may be arranged between multiple light-emitting elements, for example, between neighboring light-emitting elements. The spring sections may therefore compensate the thermal expansion differences of the connection elements and the encapsulation material arranged between the light-emitting elements.

In another exemplary embodiment of the invention, the multiple light-emitting elements are arranged along a longitudinal direction of the lighting device. For example, the lighting device may have a longitudinal direction that in particular corresponds to the longest dimension of the lighting device. The light-emitting elements are at least partially arranged along the longitudinal direction relative to each other. The light-emitting elements may for example be arranged in intervals along the longitudinal direction in regular or irregular intervals. For instance, the lighting device may substantially comprise the shape of a strip, for example with a substantially constant cross section. With this arrangement of the light-emitting elements, the lighting device may be configured basically as a semi-finished product in an "endless" or "one-dimensional" manner, significantly reducing production costs and allowing choosing the length of the lighting device after production of the semi-finished product. In some embodiments, flexible materials are used for the lighting device, such that the lighting device may be brought into a variety of shapes.

In another exemplary embodiment of the invention, at least two of the connection elements comprise spring sections, wherein the spring sections of the at least two of the connection elements are arranged staggered in respect to each other. As the connection elements comprise spring sections, the connection elements are increased in width at the spring section. When the spring sections of the connection element are arranged staggered in respect to each other, the total width of the connection elements, e.g. which are running substantially parallel to each other, may be reduced. The dimensions of the lighting device may in particular be optimized, when multiple light-emitting elements are arranged along a longitudinal direction of the lighting device.

In another exemplary embodiment of the invention, the at least one spring section comprises from half a winding to 200 windings. One winding may be understood to represent a turn or loop of the connection element around 360°. Half a winding may therefore represent a loop of 180° and in particular a semi-circular shape. A larger number of windings may improve the compensation of differences in thermal expansion, as an (elastic) deformation of the spring section is enhanced. However, a larger number of windings may also require an increase in length of each spring section. In particular, from 1 winding to 10 windings may be provided, optimizing the dimensions and the deformation properties of the spring section.

In another exemplary embodiment of the invention, the spring section comprises a helical shape. The helical shape may have a substantially circular cross section. In particular, at least part of the spring section may comprise a cylindrical and/or conical shape. Hence, a connection element such as a wire may be used that comprises a spring section resembling a coil spring. The spring section may at least partially be formed by winding the connection element around a mandrel, wherein the mandrel comprises a cylindrical and/or conical shape. In some embodiments, the spring section may also be obtained by mandrel-less winding.

In another exemplary embodiment of the invention, the at least one spring section has a flattened shape with a shorter dimension and a longer dimension. As described above, the dimensions of the connection elements (e.g. the cross section of the connection elements such as the diameter of the wire) and the configuration of the spring section (e.g. the shape of the mandrel used for forming the spring section) may be optimized in terms of requirements in electrical conductivity and thermal stability. For some applications, however, using a simple circular helical shape in the spring section would lead to a larger diameter of the helical shape, which can block part of the light emitted by the light-emitting element(s). When a flattened shape with a shorter dimension and a longer dimension of the spring section is used, an undesired blocking of light emitted by the light-emitting element can be avoided. A flattened shape of the spring section is in particular advantageous when the spring sections are arranged close to the light-emitting element, allowing for compact dimensions of the lighting device.

In some embodiments, the flattened shape is a substantially rectangular shape and/or elliptical shape. For example, a mandrel with rectangular cross section may be used to form the shape of the spring section. As an alternative, a helical shape of the spring section, as it may be obtained by means of winding with circular cross section, may be deformed or flattened to obtain for instance an elliptical shape. The winding may for instance be performed by means of a mandrel or a roll. In some embodiments, the spring section may also be obtained by mandrel-less winding.

In a preferred embodiment, the shorter dimension of the flattened shape corresponds to a light-emitting direction of the at least one light-emitting element. For example, the light-emitting element may have a light-emitting face with a light-emitting direction that represents the direction in which the maximum light intensity is emitted. In case the light-emitting element comprises an LED, a main face of an LED die may correspond to the light-emitting face with the light-emitting direction being normal to the light-emitting face. By aligning the direction of the shorter dimension of the flattened shape with the light-emitting direction, the blocking of light by the spring section is minimized, thereby maximizing the light output of the lighting device.

The length of the shortest dimension may be configured such that the amount of blocked light is minimized while providing sufficient cross section of the connection element for electrical conduction to the light-emitting element. In particular, in some embodiments, the end of the spring section along the shortest dimension may be aligned with a light-emitting face of the light-emitting device to avoid blocking of light.

In another exemplary embodiment of the invention, the at least one light-emitting element comprises at least one light-emitting diode, in particular at least one light-emitting diode arranged on an interposer. The LED may comprise at least one semiconductor element such as a p-n-junction, a diode, and/or a transistor. The LED may be provided as LED package, for example in conjunction with a substrate, lead frame and/or wire bond(s). The interposers may provide for electrical connection of the LED or LEDs to the connection elements. The interposers are in particular configured as printed circuit boards that allow for an electrical interface routing from the connection elements to the LEDs to provide the LEDs with electrical power. For instance, the interposer may comprise a flat or board-like shape with a flat-shaped LED or LED package arranged with the side opposite to a light-emitting face on the interposer. In particular, the interposer may comprise solder patches for electrical connection to the connection elements.

As already noted above, the connection elements and the at least one encapsulating material may have different thermal expansion coefficients. In particular, the thermal expansion coefficients of the connection elements and the at least one encapsulating material may differ by at least one order of magnitude or at least two orders of magnitude. In an exemplary embodiment according to the invention, the encapsulating material comprises silicone. Silicone provides highly flexible properties to the encapsulating material and therefore to the lighting device, while silicone can be easily shaped by methods such as extrusion and/or molding. In particular, silicone may have transparent properties, and may therefore be used to at least partially surround the light-emitting element. Materials based on silicone may also have reflecting and/or opaque properties, for instance when particles are embedded in the silicone. For example, by using reflective particles such as $TiO_x$ particles in the silicone (such as "white silicone"), elements made of silicone having a very high reflectivity and highly flexible properties can be obtained. In addition, white silicone may show significantly improved thermal conductivity in comparison to transparent silicone.

An electronic connection of the connection elements and the at least one light-emitting element may be established by means of soldering, for instance. In an embodiment of the invention, the connection elements may arranged in a straight configuration, wherein in particular the connection elements are arranged substantially parallel to each other, and at least one light-emitting element is disposed on the connection elements and soldered to the connection elements, for example with an interposer providing contact surfaces to the connection elements. Multiple light-emitting elements may therefore be arranged along a longitudinal direction of the lighting device, which longitudinal direction corresponds to the extension direction of the connection elements, in a simple manner. The encapsulating material may be disposed, e.g. by means of moulding or extrusion, to surround at least part of the connection elements and in particular the at least one spring section.

The at least one spring section may be provided before connecting the connection elements to the light-emitting element(s). In particular, the connecting elements may be provided as semi-finished product with spring sections.

In an exemplary embodiment of the invention, the lighting device according to the invention is used in automotive lighting, in particular as automotive interior light. With flexible properties of the lighting device, the lighting device may also be brought into different shapes according to design requirements in automotive lighting.

The features and example embodiments of the invention described above may equally pertain to the different aspects according to the present invention. In particular, with the disclosure of features relating to the lighting device according to first aspect, also corresponding features relating to a method for production according to the second aspect and to the use according to the third aspect are disclosed.

It is to be understood that the presentation of embodiments of the invention in this section is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE DRAWINGS

FIG. 5 shows an embodiment of a lighting device according to the invention in a perspective view.

DETAILED DESCRIPTION OF THE PREFERRED EMBODIMENTS

Figure 1:
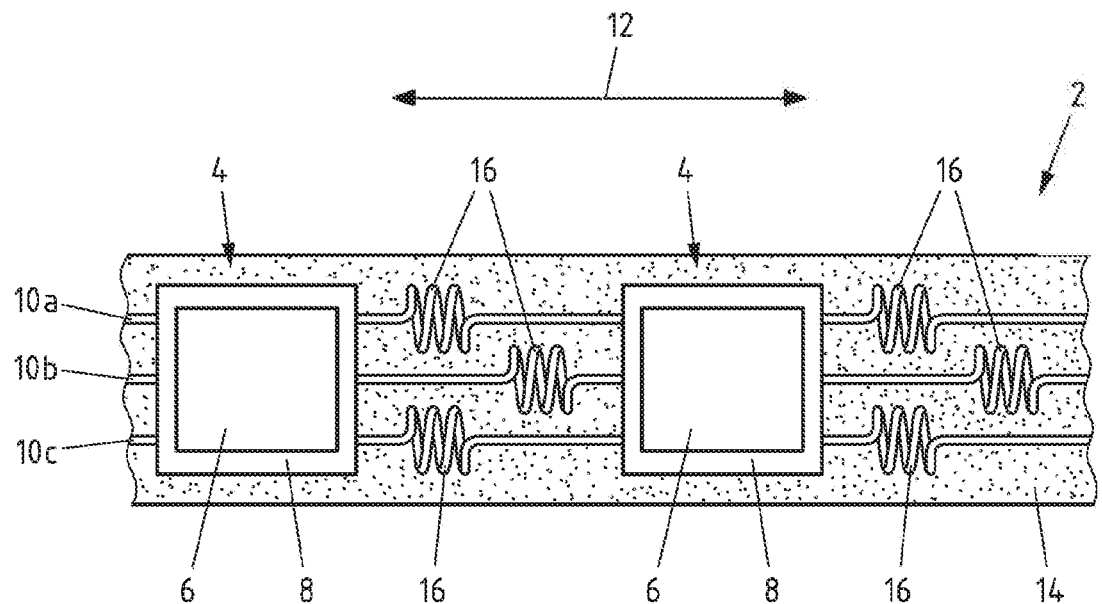
FIG. 1 shows a schematic representation of a first embodiment of a lighting device in a top view.

FIG. 1 shows a schematic representation of a first embodiment of a lighting device 2 in a top view. The lighting device 2 comprises light-emitting elements 4 with an LED 6 arranged on an interposer 8. The light-emitting elements 4 are arranged on connection elements 10a-c for an electronic connection to the light-emitting elements 4 and between the light-emitting elements 4.

The multiple light-emitting elements 4 are arranged along a longitudinal direction 12 of the lighting device 2 such that the lighting device 2 has substantially the shape of a strip. While only two light-emitting elements 4 are shown for clarity in FIG. 1, the lighting device 2 can be configured in an "endless" or "one-dimensional" manner with a high number of light-emitting elements 4 being arranged along the longitudinal direction 12. For instance, after the production of the lighting device 2 in shape of a strip, the strip may be cut into length to obtain lighting devices 2 that can optionally be deformed.

An encapsulating material 14 surrounds the connection elements 10a-c and the light-emitting elements 4. The encapsulating material 14 is based on silicone and provides protection for the connection elements 10a-c and the light-emitting elements 4 as well as electrical insulation to the connection elements 10a-c.

The connection elements 10a-c are configured as wires. Each of the connection elements 4 comprises spring sections 16, in which spring sections 16, wherein for example the wires are formed in a helical shape. The spring sections 16 are arranged between light-emitting elements 4. With the spring sections 16, the connection elements 10a-c may bend during heating up and cooling off of the lighting device 2 to compensate at least part of the heat stresses that are induced in particular at the interface to the encapsulating material 14.

The spring sections 16 of the connection elements 10a-c are arranged staggered in respect to each other in that the spring sections 16 of the connection elements 10b is arranged at a different position in the longitudinal direction 12 of the lighting device 2 than the spring sections 16 of the connection elements 10a,c. Hence, the lighting device 2 may be configured in a compact manner, as the spring sections 16 may overlap along the longitudinal direction 12 as apparent from FIG. 1.

Figure 2:
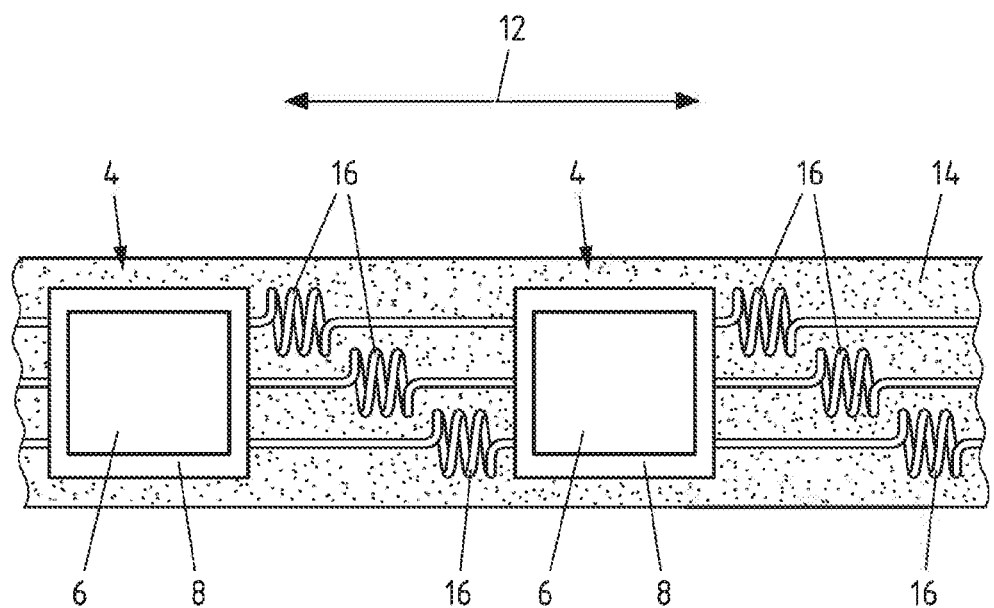
FIG. 2 shows a schematic representation of a second embodiment of a lighting device in a top view.

FIG. 2 shows a schematic representation of a second embodiment of a lighting device 2 in a top view. The lighting device 2 of FIG. 2 comprises an alternative staggered arrangement of the spring sections 16. The spring sections of each of the connection elements 10a-c are arranged at different positions along the longitudinal direction 12 in respect to each other. Also with this configuration, the lighting device 2 may be configured in a compact manner.

Figure 3A:
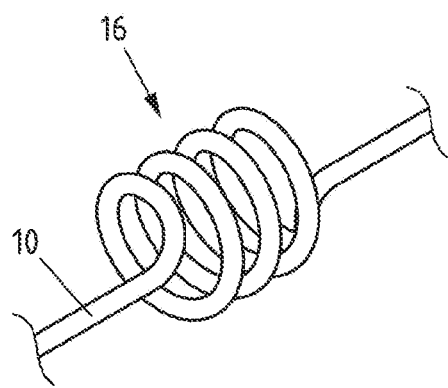
FIG. 3a-c show schematic representations of connection elements with spring sections in a perspective view.
Figure 3B:
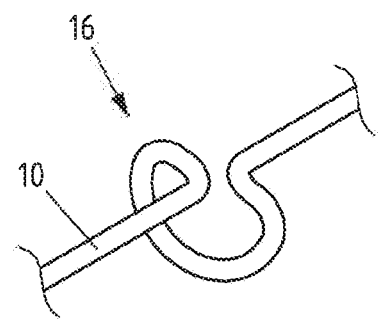
Figure 3C:
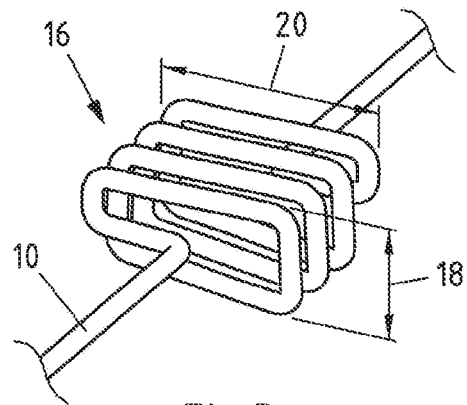

FIG. 3a-c show schematic representations of connection elements 10 with spring sections 16 in a perspective view. Different configurations of spring sections 16 are shown, which may be used individually or in combination in a lighting device according to the invention.

In FIG. 3a, the connection element 10 is formed in a helical shape in the spring section 16, i.e. the spring section 16 has a substantially circular or cylindrical circumference such as a coil spring or spiral spring. The helical shape may for instance be obtained by winding the wire for the connection element 10 around a cylindrical mandrel or roll. The number of windings, i.e. the number of complete loops in the helical shape, as well as the diameter of the spring section may be chosen depending on the diameter of the wire, the material of the wire and/or the dimensions and arrangement of the light-emitting element.

For instance, the spring section 16 may comprise from half a winding to 200 windings, in particular from 1 winding to 10 windings. FIG. 3a shows an example with 3.5 windings. In FIG. 3b, the connection element 10 is also formed in a helical shape in the spring section 16, but only has half a winding, i.e. the wire comprises a loop of 180° and has a substantially semi-circular circumference in the spring section 16. This configuration of a spring section 16 may be advantageous in that the configuration is asymmetric and a blocking of light emitted by the light-emitting element can be avoided.

FIG. 3c shows a schematic representation of another configuration of a connection element 10 with a spring section 16 in a perspective view. The spring section 16 has a flattened shape with a shorter dimension 18 and a longer dimension 20. The flattened shape is a substantially rectangular shape that may for instance be obtained by winding a wire around a mandrel comprising a rectangular cross section. The shorter dimension 18 can be arranged to correspond to a light-emitting direction of at least one light-emitting element in a lighting device to reduce the amount of light being blocked by the spring section 16. At the same time, the flattened shape allows for a large cross section of the connection element 10 to provide high electrical conductivity, as well as for a configuration of the spring section 16 sufficient to compensate thermal stresses in the lighting device.

Figure 4:
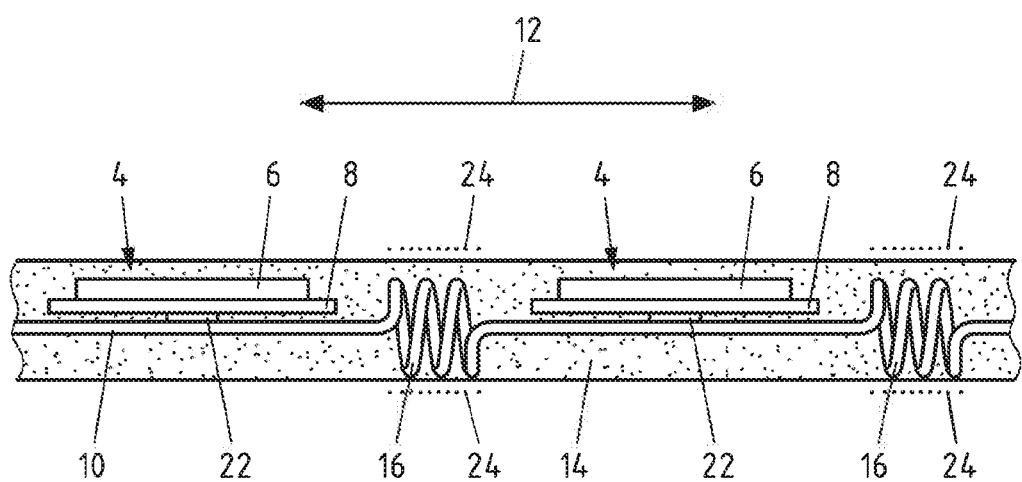
FIG. 4 shows a schematic representation of an embodiment of a lighting device in a side view.

FIG. 4 shows an embodiment of a lighting device 2 according to the invention in a side view with spring sections 16 having a flattened shape, e.g. of spring sections 16 as depicted in FIG. 3c. In can be seen from FIG. 4 that the connection element 10 is configured as continuous wire, wherein the light-emitting elements 4 are arranged on the connection element 10. An electrical and mechanical connection is made between the light-emitting elements 4 and the connection element 10 by means of solder patches 22.

The light-emitting elements 4 are configured as LEDs 6 on interposers 8, wherein the LEDs 6 also emit light towards the side and approximately in the longitudinal direction 12. The spring sections 16 have a flattened shape, wherein the shorter dimension corresponds to the light-emitting direction of the light-emitting elements 4. A blocking of light by the spring sections 16 is therefore avoided, e.g. in comparison to a circular helical shape. The corresponding dimensions of spring sections with a circular helical shape are indicated as dashed lines 24.

FIG. 5 shows an embodiment of a lighting device 2 according to the invention in a schematic perspective view. Light-emitting elements 4 are arranged along the longitudinal direction of a housing 26 of the lighting device 2. The housing 26 may for example comprise a flexible and highly reflective material such as white silicone. The encapsulating material 14 may for example comprise transparent silicone and surround the light-emitting elements 4 and the connection elements 10a-c with spring sections 16. The lighting device 2 is configured as a flexible strip. In particular, the lighting device 2 may be used in automotive lighting such as automotive interior light, wherein the lighting device 2 can conform to various shapes due to its flexible properties.

What is claimed is:

1. A lighting device, comprising:
   an encapsulating material;
   at least one connection element comprising at least one coiled spring section and at least one planar section, the at least one coiled spring section and at least one planar section each at least partially surrounded by the encapsulating material; and
   at least one light-emitting element coupled to the at least one connection element via the at least one planar section and the at least one light-emitting element coupled to at least one other light-emitting element via the at least one coiled spring section.

2. The lighting device according to claim 1, wherein the at least one connection element comprises a wire.

3. The lighting device according to claim 1, further comprising:
   at least a second light-emitting element,
   the at least one connection element providing an electronic connection between the at least one light-emitting element and the at least a second light-emitting element, and
   the at least one coiled spring section being arranged between the at least one light-emitting element and the at least a second light-emitting element.

4. The lighting device according to claim 3, further comprising the at least one light-emitting element and the at least a second light-emitting element arranged along a longitudinal direction of the lighting device.

5. The lighting device according to claim 3, further comprising at least a second coiled spring section providing electrical connection between the at least one light-emitting element and the at least a second light-emitting element, the at least a second coiled spring section arranged staggered with the at least one coiled spring section.

6. The lighting device according to claim 1, wherein the at least one coiled spring section comprises from half a winding to 200 windings.

7. The lighting device according to claim 1, wherein the coiled spring section comprises a helical shape.

8. The lighting device according to claim 1, wherein the coiled spring section comprises a flattened shape with a shorter dimension and a longer dimension.

9. The lighting device according to claim 8, wherein the flattened shape is one of a substantially rectangular shape and an elliptical shape.

10. The lighting device according to claim 8, wherein the shorter dimension corresponds to a light-emitting direction of the at least one light-emitting element.

11. The lighting device according to claim 1, wherein the at least one light-emitting element comprises at least one light-emitting diode.

12. The lighting device according to claim 1, wherein the encapsulating material comprises silicone.

13. The lighting device according to claim 1, wherein the at least one coiled spring section comprises from 1 winding to 10 windings.

14. The lighting device according to claim 1, wherein the at least one light-emitting element comprises at least one light-emitting diode arranged on an interposer.

15. The lighting device according to claim 1, wherein the at least one coiled spring section is configured to compensate for at least part of the heat stresses induced by the encapsulating material.

16. A method for producing a lighting device, the method comprising:
    electrically coupling at least one light-emitting element via at least one connection element, the at least one connection element comprising at least one coiled spring section and at least one planar section, the at least one coiled spring section and at least one planar section each at least partially surrounded by the encapsulating material; and
    at least partially embedding the at least one connection element with at least one encapsulating material, the at least one light-emitting element coupled to the at least one connection element via the at least one planar section and the at least one light-emitting element coupled to at least one other light-emitting element via the at least one coiled spring section.

17. The method of claim 16, further comprising compensating, via the at least one coiled spring, for at least part of the heat stress induced by the encapsulating material.

18. An automotive light comprising:
    an encapsulating material;
    at least one connection element comprising at least one coiled spring section and at least one planar section, the at least one coiled spring section and at least one planar section each at least partially surrounded by the encapsulating material; and
    at least one light-emitting element coupled to the at least one connection element via the at least one planar section and the at least one light-emitting element coupled to at least one other light-emitting element via the at least one coiled spring section.

19. The automotive light according to claim 18, wherein the automotive light comprises an automotive interior light.

20. The automotive light according to claim 18, wherein the at least one coiled spring section is configured to compensate for at least part of the heat stresses induced by the encapsulating material.

* * * * *